(12) United States Patent
Long et al.

(10) Patent No.: US 9,942,946 B2
(45) Date of Patent: Apr. 10, 2018

(54) DEVICE FOR GENERATING VAPOR FROM SOLID OR LIQUID STARTING MATERIAL FOR CVD OR PVD APPARATUS

(71) Applicant: AIXTRON SE, Herzogenrath (DE)

(72) Inventors: Michael Long, Herzogenrath (DE); Andreas Poqué, Aachen (DE); Claudia Cremer, Jülich (DE); Birgit Irmgard Beccard, Aachen (DE); Karl-Heinz Trimborn, Wegberg (DE)

(73) Assignee: AIXTRON SE, Herzogenrath (DE)

( * ) Notice: Subject to any disclaimer, the term of this patent is extended or adjusted under 35 U.S.C. 154(b) by 282 days.

(21) Appl. No.: 14/788,626

(22) Filed: Jun. 30, 2015

(65) Prior Publication Data
US 2016/0007410 A1    Jan. 7, 2016

(30) Foreign Application Priority Data
Jul. 1, 2014 (DE) .................... 10 2014 109 196

(51) Int. Cl.
*H05B 3/02*    (2006.01)
*H05B 3/00*    (2006.01)
(Continued)

(52) U.S. Cl.
CPC ........... *H05B 3/0014* (2013.01); *C23C 14/12* (2013.01); *C23C 14/246* (2013.01); *C23C 14/26* (2013.01);
(Continued)

(58) Field of Classification Search
CPC ........... C23C 16/4483; C23C 16/4486; C23C 16/4485; C23C 16/448; C23C 16/45502; C23C 16/4481; C23C 16/45504; C23C 16/45506; C23C 16/45565; C23C 14/12; C23C 14/228; C23C 14/246; C23C 14/26; H05B 3/0014; H05B 3/0023; H05B 3/023;
(Continued)

(56) References Cited

U.S. PATENT DOCUMENTS 2,447,789 A    8/1948    Barr
4,769,296 A    9/1988    Sterzel
(Continued)

FOREIGN PATENT DOCUMENTS

DE    102011051260 A1    12/2012
DE    102011051261 A1    12/2012
(Continued)

*Primary Examiner* — Shawntina Fuqua
(74) *Attorney, Agent, or Firm* — Ascenda Law Group, PC

(57) ABSTRACT

In a device for generating a vapor for a CVD or PVD apparatus, at least two thermal transfer bodies are arranged successively in the direction of flow of a carrier gas. The device also includes an inlet pipe for feeding an aerosol to one of the thermal transfer bodies for vaporization of the aerosol by bringing the aerosol particles into contact with thermal transfer surfaces of the thermal transfer body. At least one of the thermal transfer bodies has an opening for an inlet pipe that has a first flow channel for feeding the aerosol in and a second flow channel for feeding a carrier gas in. Gas passage openings are provided through which the carrier gas flows out of the second flow channel into the first flow channel. The second flow channel is sealed in the area of the mouth of the inlet pipe.

**15

(51) Int. Cl.
 *C23C 14/12* (2006.01)
 *C23C 14/24* (2006.01)
 *C23C 14/26* (2006.01)
 *C23C 16/448* (2006.01)
 *C23C 16/455* (2006.01)
 *H05B 3/06* (2006.01)

(52) U.S. Cl.
 CPC .... *C23C 16/4483* (2013.01); *C23C 16/45565* (2013.01); *H05B 3/026* (2013.01); *H05B 3/06* (2013.01)

(58) Field of Classification Search
 CPC .......... H05B 3/026; H05B 3/12; H05B 3/143; H05B 3/0004; H05B 3/10; H05B 3/06; H01L 51/0008
 See application file for complete search history.

(56) References Cited

U.S. PATENT DOCUMENTS

| | | | |
|---|---|---|---|
| 4,885,211 A | | 12/1989 | Tang et al. |
| 5,356,476 A | * | 10/1994 | Foster ............... C23C 16/14 118/715 |
| 6,837,939 B1 | * | 1/2005 | Klug ................. C23C 14/12 118/726 |
| 2013/0130475 A1 | * | 5/2013 | Barden ............ H01L 21/02562 438/478 |

FOREIGN PATENT DOCUMENTS

| | | |
|---|---|---|
| EP | 0982411 A2 | 3/2000 |
| WO | 2012/175124 A1 | 12/2012 |
| WO | 2012/175126 A1 | 12/2012 |
| WO | 2012/175128 A1 | 12/2012 |

* cited by examiner

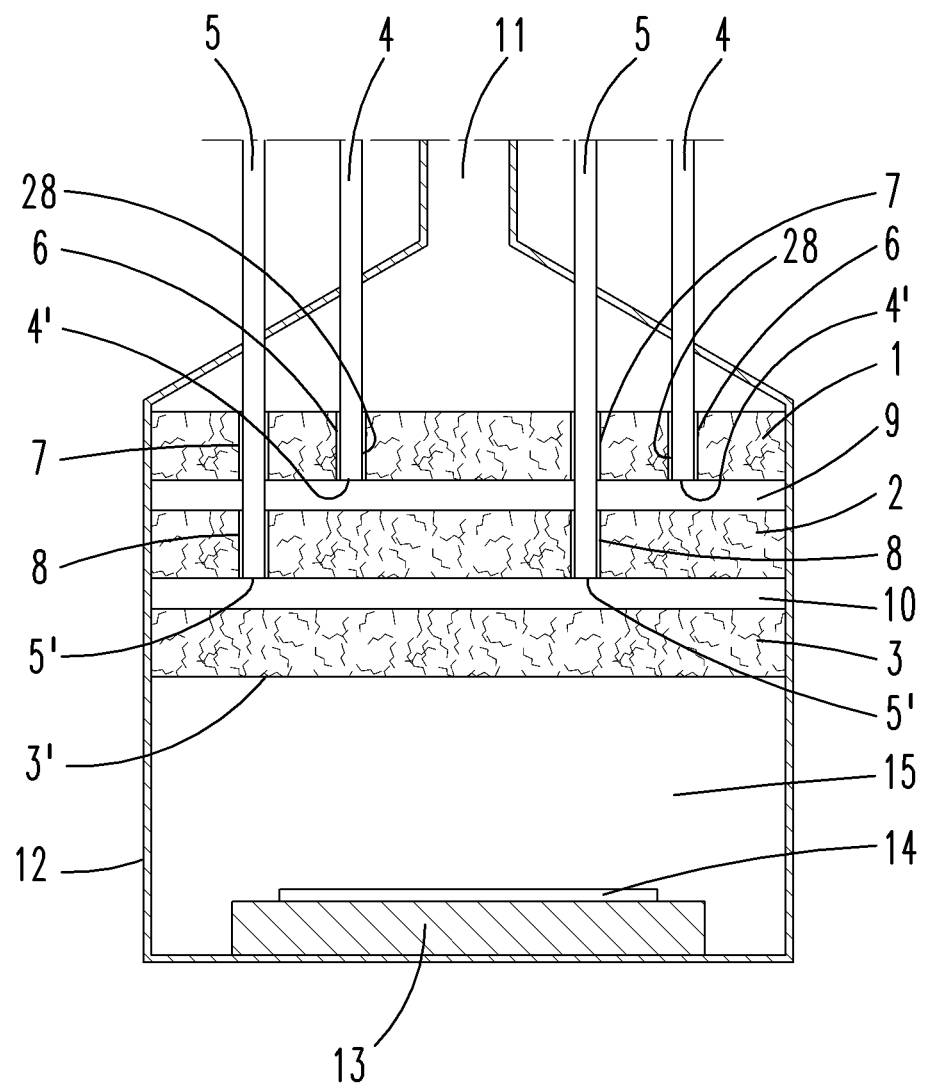

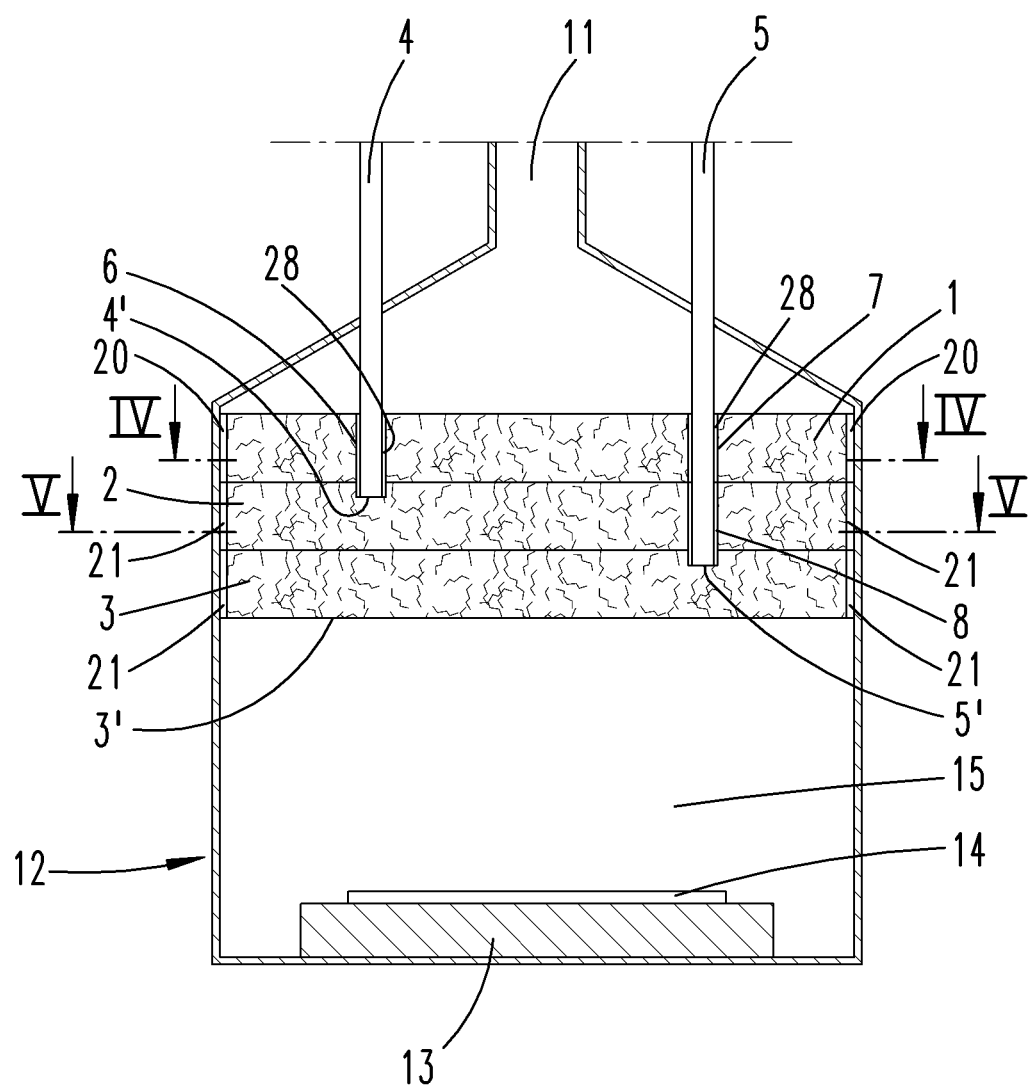

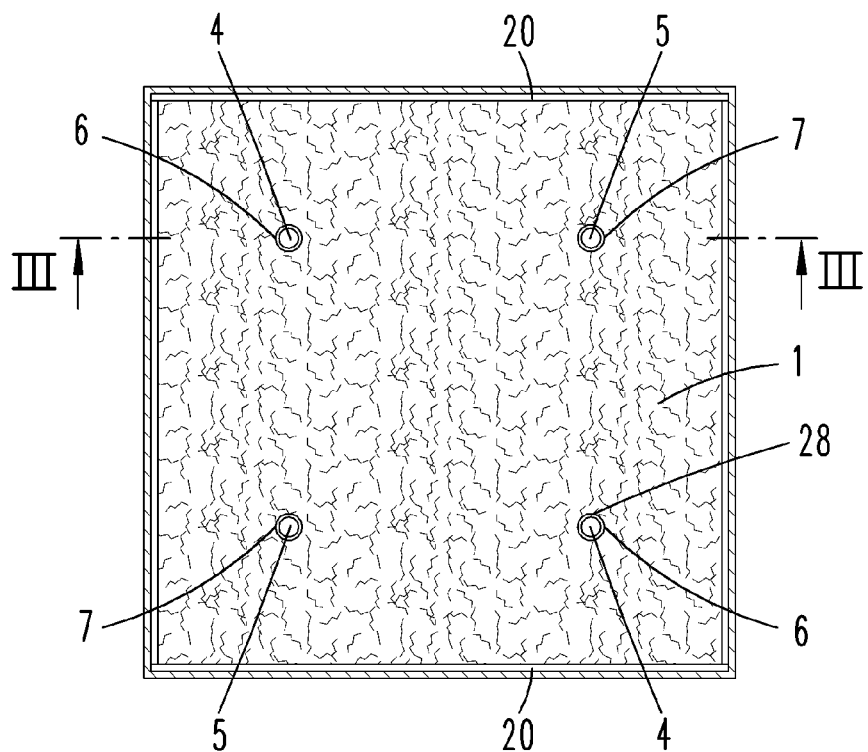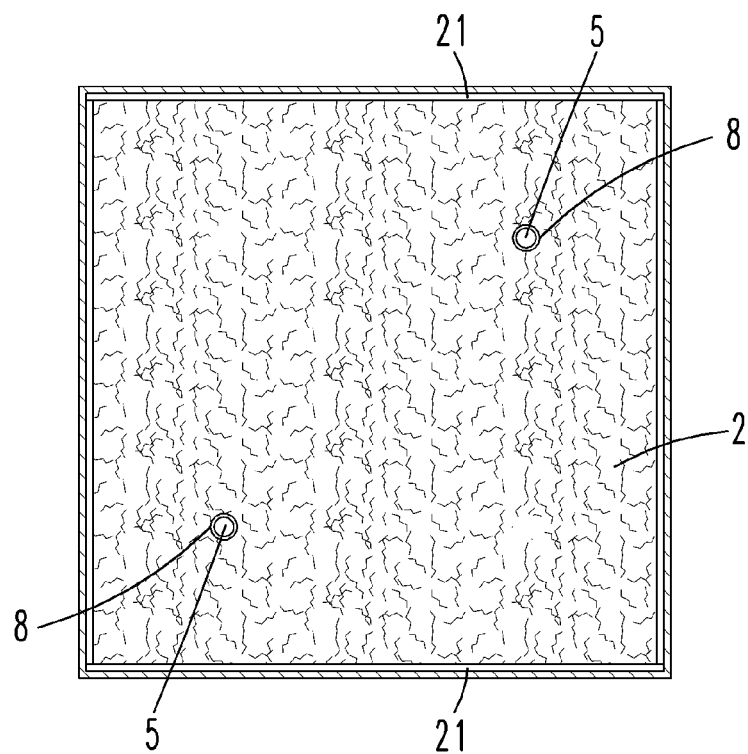

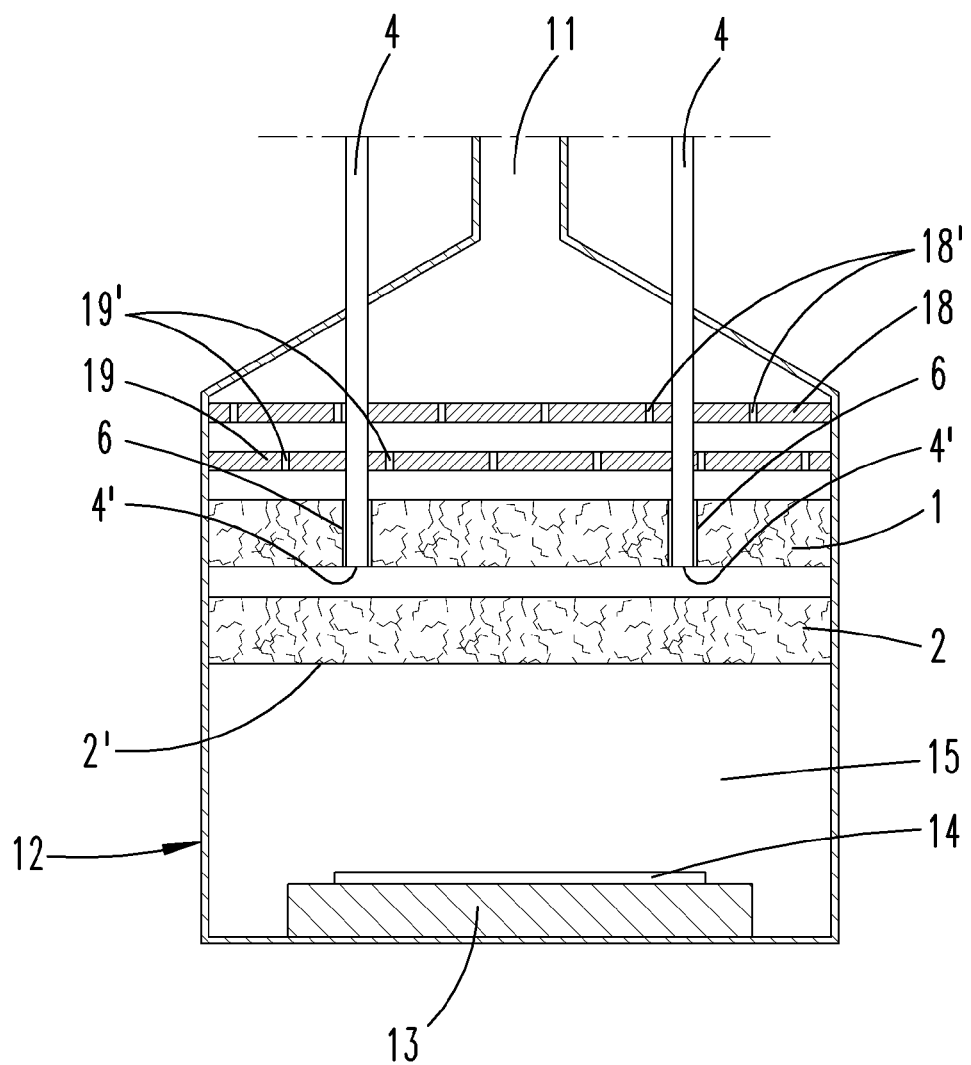

DEVICE FOR GENERATING VAPOR FROM SOLID OR LIQUID STARTING MATERIAL FOR CVD OR PVD APPARATUS

RELATED APPLICATIONS

This application claims the priority benefit of DE Application No. 10 2014 109 196.5, filed 1 Jul. 2014.

FIELD OF THE INVENTION

The invention relates to a device for generating a vapor for a CVD or PVD apparatus with at least two thermal transfer bodies arranged successively in the direction of flow of a carrier gas and having thermal transfer surfaces, each of which can be heated to a thermal transfer temperature, with an inlet pipe for feeding an aerosol to one of the thermal transfer bodies for vaporization of the aerosol by bringing the aerosol particles in contact with the thermal transfer surfaces.

The invention further relates to a device for generating a vapor for a CVD or PVD apparatus with at least one transfer body having thermal transfer surfaces that can be heated to a thermal transfer temperature, and with an inlet pipe for feeding an aerosol to the thermal transfer body for vaporization of the aerosol by bringing the aerosol particles in contact with the thermal transfer surfaces.

BACKGROUND

DE 10 2011 051 260 A1 describes a device for generating a vapor. Several thermal transfer bodies, each with different cross sections, are arranged successively in a housing in the direction of flow. An inlet pipe for feeding an aerosol through an upstream thermal transfer body projects through a housing front surface and leads to a central cavity of the device.

In a device described in WO 2012/175128 A1, a housing contains a CVD or a PVD apparatus and a vaporization device having two thermal transfer bodies arranged successively in the direction of flow of an aerosol. The two thermal transfer bodies are formed by electrically conductive solid foams that are heated by passage of an electrical current through them. An aerosol is introduced through a feed line into the vaporizer. The aerosol particles come into contact with the thermal transfer surfaces of the thermal transfer bodies, whereby the particles are vaporized. Similar devices are described in WO 2012/175124 A1, WO 2012/175126 A1 as well as DE 10 2011 051 261 A1.

The production of light-emitting diodes (OLEDs) from organic starting materials is known from U.S. Pat. No. 4,769,296 and U.S. Pat. No. 4,885,211. To produce these OLEDs, solid or liquid starting materials must be brought into a gaseous form. This is done using a vaporizer. The gasified starting material is fed as vapor into a processing chamber of a CVD or PVD reactor, where the vapor condenses on a substrate.

Methods for depositing layers in the low-pressure range are also described by U.S. Pat. No. 2,447,789 and EP 0 982 411.

SUMMARY OF THE INVENTION

The starting materials used to deposit OLEDs must only be subjected to a maximum vaporization temperature, since they are broken down at relatively low temperatures. This chemical breakdown temperature should not be reached, or only for a very brief period.

It is the object of the invention to improve a generic vaporizer in terms of its process technology.

The object is achieved by the invention indicated in the claims.

According to a first aspect of the invention, it is first substantially proposed that one of the thermal transfer bodies have an opening in which an inlet pipe is located. The inlet pipe has a mouth through which an aerosol can be fed into the housing such that the aerosol particles vaporize as a result of being brought in contact with the thermal transfer surfaces. The mouth of the inlet pipe is arranged downstream from the mouth of the carrier gas feed line in the housing such that the carrier gas is first preheated in a preheating body before it mixes with the vaporized aerosol. The mouth of the feed line is therefore downstream from an upstream area of the preheating body, through which the carrier gas flows. By virtue of this design, it is also possible to insert the inlet pipe counter to the direction of flow of the carrier gas into an opening of the thermal transfer body. The mouth of the feed line is then located in the upstream area of the thermal transfer body or in an intermediate space between the thermal transfer body having the opening and a thermal transfer body arranged upstream with respect to this thermal transfer body. According to the invention, a provision is preferably made that the opening is associated with an upstream thermal transfer body and the mouth of the inlet pipe is arranged in the direction of flow before or in a downstream thermal transfer body. Preferably, however, the one or more inlet pipes lead to a spacing gap between two thermal transfer bodies, so that the aerosol exiting the mouth of the at least one inlet pipe can enter into the downstream thermal transfer body over as large an area as possible. The first thermal body in the direction of flow and hence upstream thermal transfer body can be a preheating body for a carrier gas. This first thermal transfer body can have the opening through which the feed line for feeding an aerosol engages. The feed line leads either to a downstream thermal transfer body or to a spacing gap immediately upstream from the downstream thermal transfer body. By virtue of this design, it is ensured that only the carrier gas flows through the thermal transfer body upstream in the direction of flow that is preheated. In contrast, the aerosol is also fed into the downstream thermal transfer body in addition to the carrier gas, whereby the aerosol particles are able to come into contact with the thermal transfer surfaces of the thermal transfer body. There, the vaporization heat is transferred to the particles, whereby the solid or liquid aerosol particles are brought into the gaseous form. A provision is particularly made that several thermal transfer bodies, each of which has a vaporization function, are arranged successively in the manner of a cascade. In such an arrangement, a provision is made that a downstream thermal transfer body having the function of a vaporization body also has one or more openings through which a feed line is placed and which lead to a spacing gap downstream from this thermal transfer body or to a downstream thermal transfer body. By virtue of this design, a first aerosol is vaporized in an upstream vaporization body and a second aerosol is vaporized in a downstream vaporization body. The two aerosols can be vaporized at different vaporization temperatures. Preferably, one aerosol having a low vaporization temperature is fed into an upstream vaporization body the aerosol having a high vaporization temperature is fed into a downstream vaporization body. The downstream vaporization body then has a higher thermal transfer temperature than the thermal transfer temperature of the upstream vaporization body. It is thus possible to arrange three or more thermal transfer bodies successively in the direction of flow, in which case the first thermal transfer body in the direction of flow merely serves to heat a carrier gas and each of the several downstream thermal transfer bodies is used to heat an aerosol and to vaporize the aerosol. The aerosol vaporized in an upstream vaporization body passes as vapor through the downstream vaporization body, into which another aerosol is fed through a feed line. The vaporization bodies are preferably made of the same material as described in WO 2012/175128 A1. This is an open-celled solid foam with a porosity of 400 to 100 pores per inch. The vaporization body is electrically conductive, so that is can be heated to its vaporization temperature by passing an electrical current through it. For this purpose, the vaporization body, which preferably has a rectangular outline, preferably has electrical contacts on two opposing narrow sides through which the electrical current can be introduced into the vaporization body. The inlet pipes can be made of electrically insulated material or of metal. If the inlet pipes are made of metal, they are enclosed in the area of the openings by an electrically insulating sleeve. The thermal transfer bodies, at least one of which forms a vaporization body, are located in a housing. They extend over the entire housing cross-sectional surface, so that the carrier gas fed upstream into the housing must flow through all of the successively arranged thermal transfer bodies. The aerosol or the vapor generated from the aerosol flows through at least the last thermal transfer body in the direction of flow. The vapor outlet area of the last thermal transfer body can be a gas inlet area through which the carrier gas and the vaporized aerosols transported by the carrier gas are introduced into a processing chamber. The processing chamber of the CVD-PVD reactor is thus located in the direction of flow immediately below the last thermal transfer body in the direction of flow. A substantially homogeneous gas flow flows through the gas outlet area of this thermal transfer body into the processing chamber. A substrate is located on the floor of the processing chamber on which the vapor condenses. The susceptor, which bears the substrate, is preferably cooled by a cooling device.

A second aspect of the invention relates to a return flow check valve that is arranged before the first thermal transfer body in the direction of flow. The return flow check valve is thus located between the carrier gas feed line and the first thermal transfer body. The return flow check valve preferably consists of two plate-shaped bodies that extend over the entire cross-sectional surface of the housing of the vaporizer. The two plates have openings through which the carrier gas can flow. The openings of the two plates are offset with respect to each other, whereby the carrier gas must first pass through the openings of the upstream return flow stop plate, upon which it is diverted into the intermediate space in order to then pass through the openings of the second return flow stop plate.

The invention further relates to the development of an inlet pipe. The inlet pipe according to the invention has means with which the gas flow emerging from the mouth of the inlet pipe is expanded, so that the gas flow can enter into the thermal transfer body over as large a surface as possible. An inlet pipe developed according to the invention preferably leads to a spacing gap between two thermal transfer bodies. However, it can also lead upstream from a thermal transfer body into a volume segment of a housing. The inlet pipe preferably has two flow channels, with a first flow channel being provided to conduct the aerosol through and a second flow channel being provided to feed a carrier gas through passage openings into the first flow channel. The flow within the first flow channel is influenced by the carrier gas leading through the passage opening into the first flow channel. The first flow channel preferably has a cross-sectional surface that is larger than the cross-sectional surface of the second flow channel. A turbulent flow can be generated with the carrier gas flows that pass through the one or more gas passage openings. For this purpose, first gas passage openings are particularly provided which lead into the first flow channel at an acute angle to the direction of extension of the first flow channel or to the direction of flow of the aerosol. Second gas passage openings can be provided which are particularly arranged downstream from the first gas passage in the direction of flow and, especially preferably, are arranged in the area of the mouth of the inlet pipe. These second gas passage openings are intended to generate an angular momentum. The second gas passage openings do not lead into the first flow channel only at an acute angle, i.e., to the direction of flow of the aerosol. Rather, the second gas passage openings are also aligned obliquely with respect to a cross-sectional plane through the flow channel, so that a carrier gas flow rotating clockwise or counterclockwise is fed into the first flow channel. This produces a vortex. The centrifugal forces caused thereby bring about an expansion of the gas flow emerging from the mouth of the feed line. In a development of the invention, a provision is further made that the two flow channels are formed from two nested pipes, so that the flow channels are arranged coaxially with respect to each other, the aerosol flowing through the inner flow channel. The pipe forming the first flow channel has a widening at its mouth, whereby the cross-sectional surface of the first flow channel becomes continuously larger on the mouth side in the direction of flow out to the end of the inlet pipe. This also results in an expansion of the gas flow emerging from the mouth. Several first and second gas passage openings are arranged successively in the direction of flow. The inlet pipe has a central flow channel through which the aerosol flows. This flow channel is surrounded by a wall. This wall is preferably cooled. For this purpose, means for cooling the wall of the flow channel are provided. This can be a flow channel into which a cold coolant is fed. The coolant can be a carrier gas that flows through the previously described opening from a radially outside flow channel into a radially inside flow channel. It is also possible, however, to enclose the wall of the flow channel through which the aerosol flows with a cooling sleeve that is liquid-cooled, for example, or in which other measures are provided for transporting heat away. As a result, a vaporization and possible recondensation of the aerosol within the feed line is prevented from occurring, for one. Under vacuum conditions, AlQ3 goes from the solid state directly into the gaseous state. Other organic materials, such as NPD, for example, melt before vaporization. A provision is therefore made that, for another, the wall of the flow channel is maintained at a temperature below the melting point of the aerosol particle. This prevents melting of the aerosol particles within the feed line.

BRIEF DESCRIPTION OF THE DRAWINGS

Exemplary embodiments of the invention are explained below with reference to the enclosed drawings. Shown are:

FIG. 2 shows a second exemplary embodiment of the invention, in which the gas outlet area of the last thermal transfer body 3 in the direction of flow is simultaneously a gas inlet area of a processing chamber 15;

FIG. 3 shows a third exemplary embodiment of the invention, also in a longitudinal sectional representation along line III-III in FIG. 4;

FIG. 4 shows the section along line IV-IV in FIG. 3;

FIG. 5 shows the section along line V-V in FIG. 3;

FIG. 6 shows a fourth exemplary embodiment of the invention;

DETAILED DESCRIPTION

Figure 1:
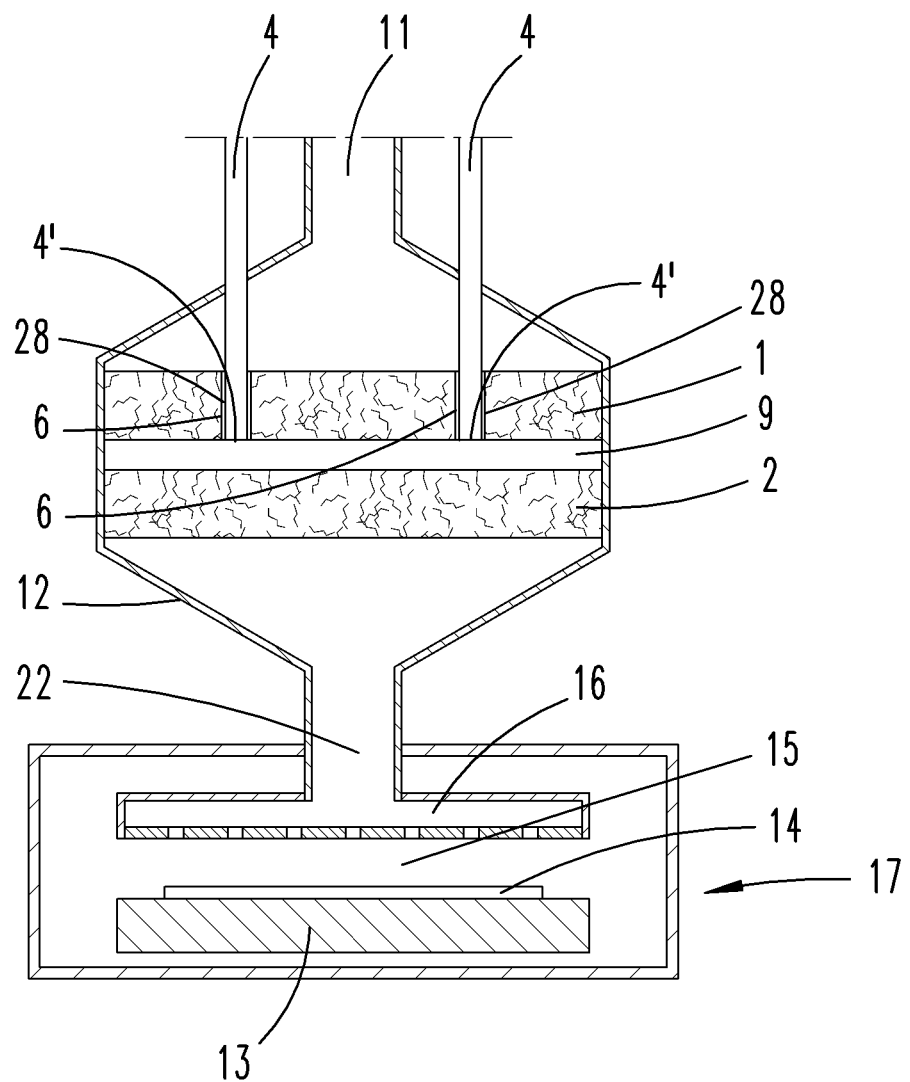
FIG. 1 shows, in the form of a longitudinal section, a first exemplary embodiment of the invention, in which a vaporization device is located upstream from a CVD reactor.

The devices, which are shown only schematically in the drawings, are used to deposit OLED layers on substrates 14 lying on a cooled susceptor 13 in a processing chamber 15. Process gas produced from vaporized aerosols is fed into the processing chamber 15. This is done with the aid of a carrier gas that is fed through a carrier gas feed line 11 into the housing 12 of a vaporizer. Several thermal transfer bodies 1, 2, 3 are located in the vaporizer. The thermal transfer bodies 1, 2, 3 extend over the entire cross-sectional surface of the vaporizer housing 12 and are arranged successively in the direction of flow. As a result, the carrier gas fed through the carrier gas infeed opening 11, which can be an inert gas, $H_2$, $N_2$ or a noble gas, flows through all of the thermal transfer bodies 1, 2, 3 in the direction of flow.

In the exemplary embodiments, a thermal transfer body 1 arranged highest in the direction of flow forms a preheating body for preheating the carrier gas. However, a provision can also be made that the preheating of the carrier gas takes place outside of the vaporizer housing 12, so that the thermal transfer body arranged first in the direction of flow of the carrier gas within the vaporizer housing 12 is a vaporization body for one of the aerosols it.

Two vaporization bodies 2, 3 arranged successively in the direction of flow are provided which lie downstream from the preheating body 1 in all exemplary embodiments. Aerosols that are different from one another are fed into the vaporization bodies 2, 3 by means of feed lines 4, 5. This is done in such a way that a first aerosol with a low vaporization temperature is vaporized through the inlet pipe 4 in an upstream vaporization body 2 and a second aerosol having a higher vaporization temperature is fed into a second vaporization body 3 that is arranged downstream from the first vaporization body 2.

The preheating body 1 and the two vaporization bodies 2, 3 arranged downstream therefrom are each formed by a thermal transfer body. The thermal transfer bodies 1, 2, 3 are made of a solid foam. The solid foam has open cells and a porosity in the range between 400 and 100 pores per inch.

The feeding-in of the aerosols is done according to the invention through pipe-shaped feed lines 4, 5 that project through openings 6, 7, 8 of thermal transfer bodies 1, 2, 3 or are inserted into openings 6, 8 of the thermal transfer bodies 2, 3. The openings preferably extent in the direction of flow of the carrier gas, the inlet pipes then being inserted either in the direction of flow or counter to the direction of flow into the opening 6, 7, 8.

In the exemplary embodiment shown in FIG. 1, only one vaporization body 2 is provided. It is located together with a preheating body 1 for the carrier gas in the housing 12 of the vaporization device. The preheating body 1, i.e., the upstream thermal transfer body 1, is spaced apart in the direction of flow from the downstream thermal transfer body 2, i.e., a vaporization body. A spacing gap 9 is thus formed between the two thermal transfer bodies 1, 2. The mouths 4' of inlet pipes 4 that engage through openings 6 of the thermal transfer body 1 in the direction of flow of the carrier gas 11 lead to this spacing gap 9. The inner diameter of the openings 6 corresponds to the outer diameter of the inlet pipes 4, so that the inlet pipes 4 rest with contact against the inner wall of the opening 6. An aerosol is fed through the feed lines 4 into the spacing gap 9. The aerosol is transported together with the carrier gas preheated by passage through the preheating body 1 into the second thermal transfer body 2. There, the particles of the aerosol come into touching contact with the thermal transfer surfaces of the thermal transfer body 2. Vaporization heat is fed to the particles of the aerosol, so that a vaporized aerosol emerges together with the carrier gas from the gas outlet area of the thermal transfer body 2. The heat is supplied by means of electrical current. The vapor and the carrier gas exit the vaporizer 12 through a gas outlet opening 22 and travel into a gas inlet member 16 of a CVD reactor 17. The carrier gas and the vaporized aerosol pass through the gas outlet openings of the gas inlet member 16 into the processing chamber 15. The inlet pipes 4 are made of metal and insulated from the thermal transfer body 1 by means of insulating sleeves 28.

In the second exemplary embodiment shown in FIG. 2, another thermal transfer body 3 is arranged beneath the thermal transfer body 2. A second spacing gap 10 forms between the thermal transfer body 2 and the thermal transfer body 3. Inlet pipes 5 for feeding a second aerosol into the spacing gap 10 lead to the spacing gap 10. The inlet pipes 5 are located in openings 7 of the thermal transfer body 1 and openings 8 of the thermal transfer body 2. The second aerosol is thus conducted through the inlet pipe 5 through both thermal transfer bodies 1 and 2.

The thermal transfer bodies 2, 3 can also be operated at the same thermal transfer temperature. Preferably, however, the downstream thermal transfer body 3 has a higher thermal transfer temperature than the upstream thermal transfer body 2 or the preheating body 1. In this way, it is possible to vaporize a second aerosol in the thermal transfer body 3 that has a higher vaporization temperature than the first aerosol, which is fed through feed lines 4 into the intermediate space 9 and into the thermal transfer body 2.

Unlike the first exemplary embodiment, the gas outlet area 3' of the last thermal transfer body 3 in the direction of flow forms an infeed area through which the vaporized aerosol enters the processing chamber 15 together with the carrier gas.

In the exemplary embodiment shown in FIG. 3, the three thermal transfer bodies 1, 2, 3 arranged successively in the direction of flow rest in a contacting manner against each other, so that there are no spacing gaps between the thermal transfer bodies 1, 2, 3 arranged successively in the direction of flow. In this exemplary embodiment, the mouth 4' of the inlet pipe 4 is located in an upstream section of the first vaporization body 2. Like the first inlet pipe 4, the second inlet pipe 5 penetrates through an opening of the first thermal transfer body 1 in the direction of flow and, in addition, an opening 8 of the second thermal transfer body 2 in the direction of flow, so that the mouth 5' of the inlet pipe 5 leads into an upstream section of the third thermal transfer body 3. Here, too, two different aerosols are vaporized at different temperatures in different thermal transfer bodies 2, 3.

The vaporization energy is supplied by feed line as electrical current. For this purpose, the thermal transfer bodies 1, 2, 3 have electrical contact areas 20, 21. In the exemplary embodiment, the thermal transfer bodies have a rectangular outline, so that the electrical contact areas 20, 21 are associated with mutually opposing narrow side walls of the thermal transfer body 1, 2, 3.

The fourth exemplary embodiment shown in FIG. 6 also shows a return flow check valve that is formed by two plate-shaped return flow stop plates 18, 19. The two return flow stop plates 18, 19 are located in the direction of flow between the infeed opening 11 for feeding in the carrier gas and the first thermal transfer body 1 in the direction of flow. The inlet pipes 4, 5 penetrate through the return flow stop plates 18, 19. They have appropriate openings for this purpose. Essential features on the return flow stop plates 18, 19 are openings 18' of the return flow stop plate 18 and openings 19' of the return flow stop plate 19. The openings 18' and 19' are offset with respect to each other in the direction of flow, so that a carrier gas passing from the carrier gas feed line 11 into the housing 12 must first pass through the openings 18' of the upstream return flow stop plate 18, upon which it is diverted into a spacing gap between the two return flow stop plates 18, 19 and then emerges through the openings 19' of the downstream return flow stop plate 19. The return flow stop plate arrangement is intended to prevent vapor of a generated aerosol emerging from the upstream surface of the thermal transfer bodies from getting into the upper area of the vaporization housing 12.

Figure 7:
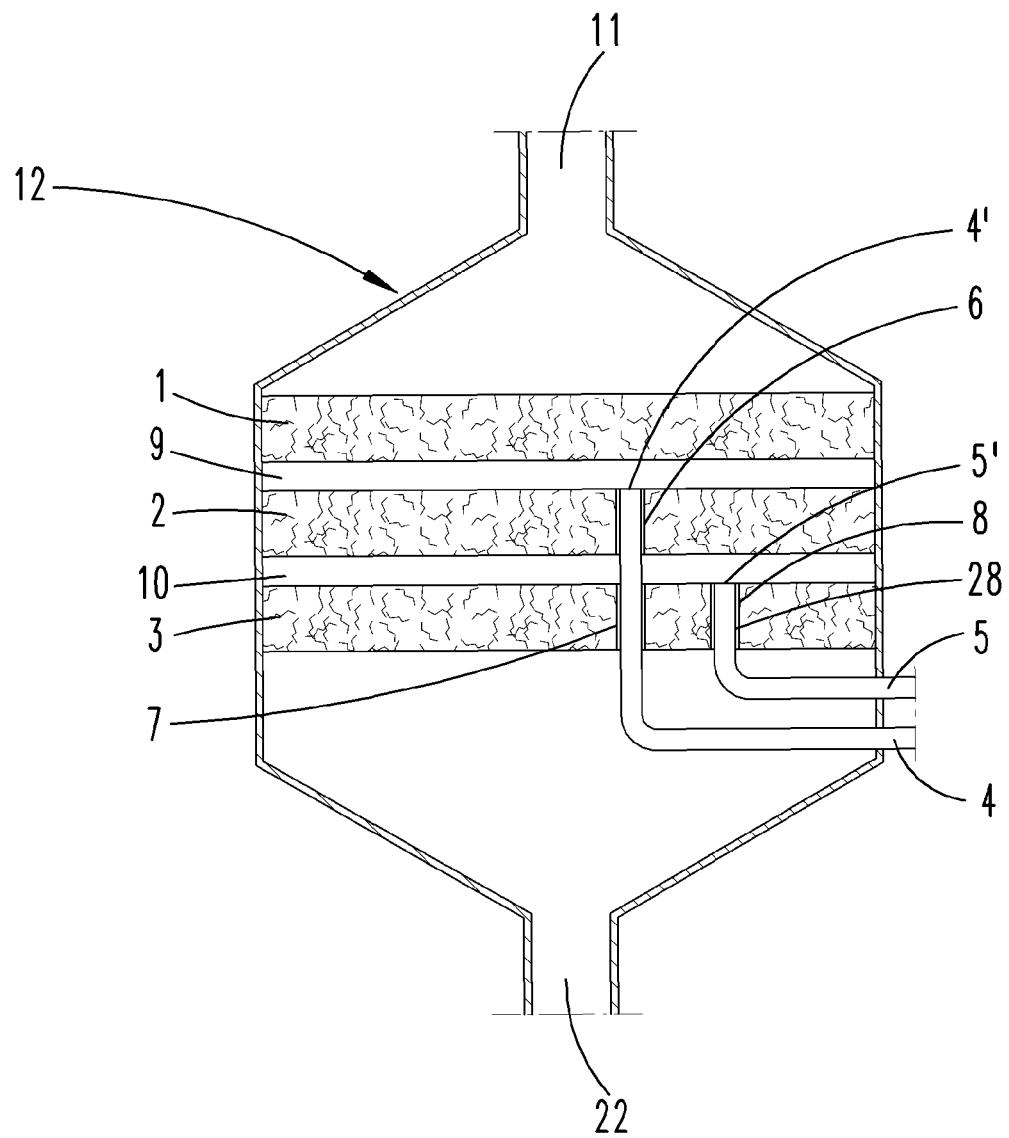
FIG. 7 shows a fifth exemplary embodiment of the invention.

In the fifth exemplary embodiment shown in FIG. 7, the aerosol is not fed through inlet pipes 4, 5 inserted into the thermal transfer bodies 1, 2 in the direction of flow of the carrier gas, but through inlet pipes 4, 5 that are inserted counter to the direction of flow of the carrier gas into openings 6, 7, 8 of the thermal transfer bodies 2, 3. The inlet pipes 4, 5 are supplied here from below, as it were. The inlet pipe 4 through which the first aerosol passes into the intermediate space 9 between the preheating body 1 and the first vaporization body 2 thus penetrates through openings 7, 6 of both vaporization bodies 2, 3. Here, too, and like in all of the exemplary embodiments, the outer walls of the inlet pipes 4, 5 and the outer walls of the insulating sleeve 28 enclosing the inlet pipes 4, 5 rest in a contacting manner against the inner wall of the respective opening 6, 7, 8 of the respective thermal transfer body 1, 2, 3.

The inlet pipe 5, whose mouth 5' is arranged in the second intermediate space 10 between the vaporization body 2 and the vaporization body 3, penetrates through only one opening 8 of the downstream vaporization body 3 in the direction of flow.

Figure 8:
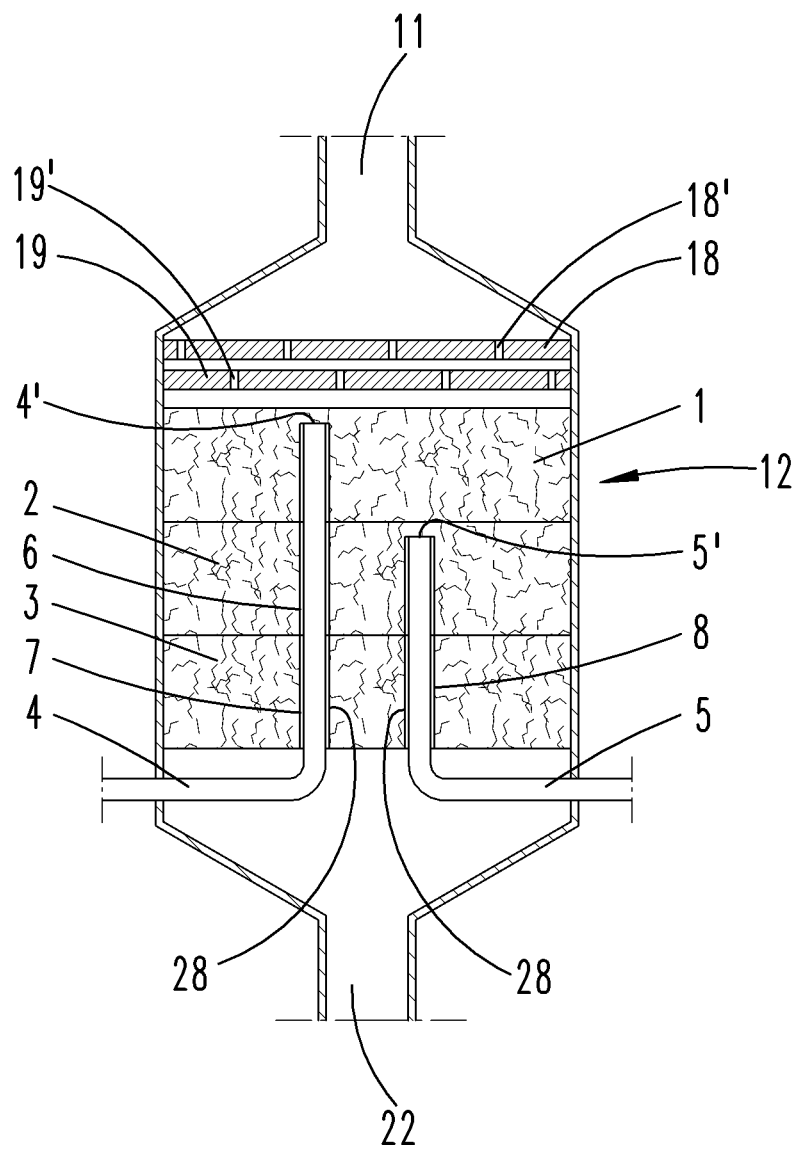
FIG. 8 shows a sixth exemplary embodiment of the invention.
Figure 9:
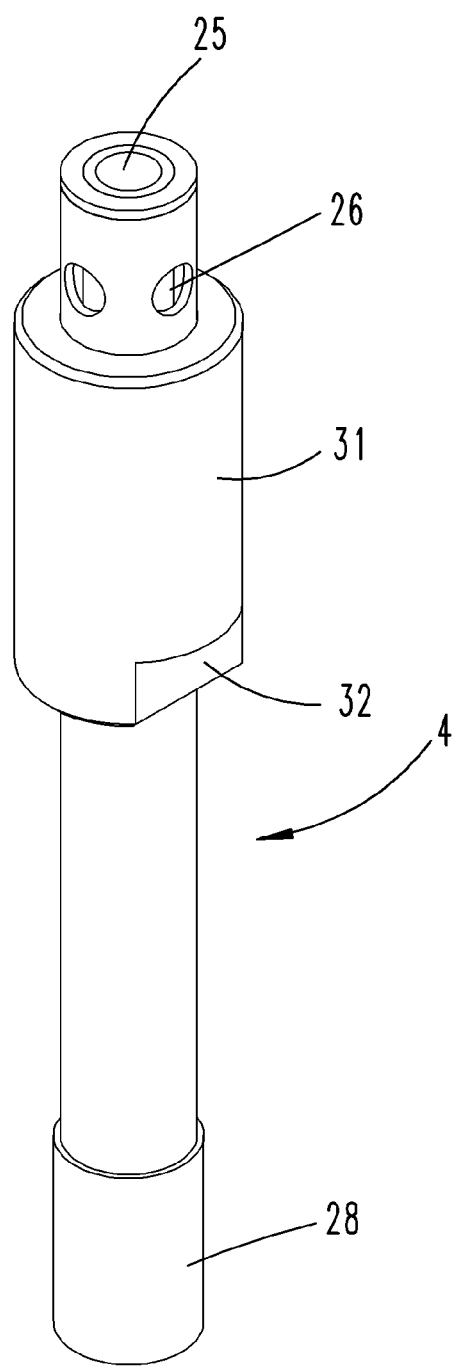
FIG. 9 shows a perspective view of an inlet pipe according to the invention.
Figure 10:
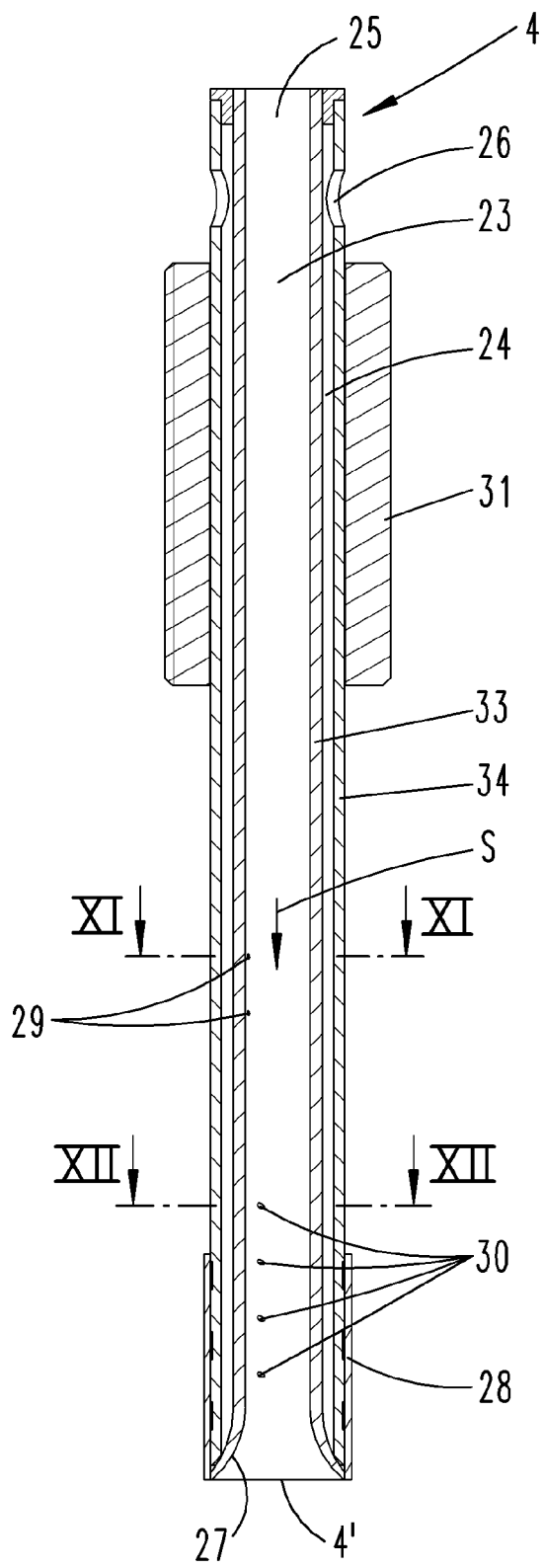
FIG. 10 shows the longitudinal section through the inlet pipe shown in FIG. 9.
Figure 11:
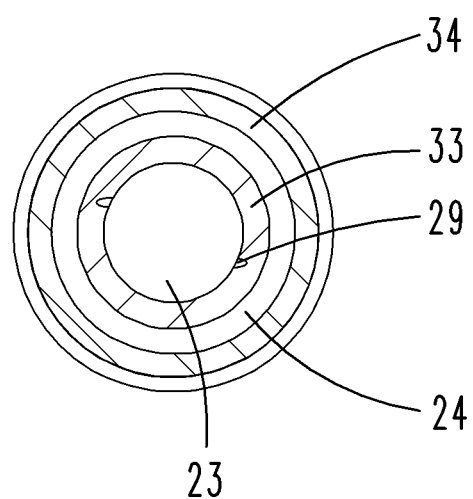
FIG. 11 shows the section along line XI-XI in FIG. 10.
Figure 12:
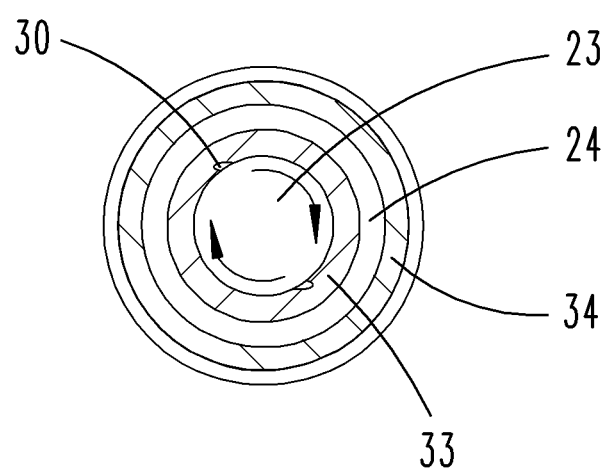
FIG. 12 shows the section along line XII-XII in FIG. 10.

The sixth exemplary embodiment shown in FIG. 8 shows a vaporization device 12 in which, similarly to the third exemplary embodiment shown in FIG. 3, three thermal transfer bodies 1, 2, 3 are arranged in immediate succession in the direction of flow of the carrier gas. In addition, this exemplary embodiment has the above-described return flow stop plate arrangement 18, 19.

Here, the mouth 4' of the inlet pipe 4 leads into the preheating body 1, particularly directly below its upper edge. The mouth 5' of the feed line 5 is located directly beneath the upper edge of the first vaporization body 2. Here, the inlet pipe 5 is located in an opening 8 of the vaporization body 3. The inlet pipe 4 is located in an opening 6 of the vaporization body 2 and penetrates through an opening 7 of the vaporization body 3.

FIGS. 9 to 12 show an inlet pipe 4 embodied according to the invention. The inlet pipe 4 consists of two concentrically nested pipes 33, 34, the upper and lower edge of the inner pipe 33 being connected in a gas-tight manner to the upper and lower edge of the outer pipe 34. The pipe opening of the inner pipe 33 forms a first flow channel 23 through which an aerosol can be conducted that is fed through an axial infeed opening 25 into the first flow channel 23. The inner pipe 33 is widened radially outward in the area of the mouth 4' of the inlet pipe 4. The opening-side end segment of the outer pipe 34 is enclosed by a sleeve 28 made of insulating material. The pipes 33, 34 themselves are made of metal, particularly stainless steel.

The outer pipe 34 has a total of four radial infeed openings 26 through which a carrier gas can be fed into the flow channel 24 that is located between inner pipe 33 and outer pipe 34. The flow channel 24 is connected via first passage openings 29 and second passage openings 30 to the first, inner flow channel 23. The gas passage openings 29, 30 formed in this way are embodied by small-diameter bores, thus enabling gas flows to pass through at a high flow velocity. The first gas passage openings 29 have an inclination, so that then "gas jets" emerging there enter the flow channel 23 obliquely to the direction of flow S. The gas passage openings 29 can have not only an inclination in the direction of flow S, but also an inclination in the tangential direction, whereby the gas flows emerging from them can also produce a vortex. The first gas passage openings 29 are used to generate turbulence within the first flow channel 23. The first gas passage openings 29 are arranged upstream from the second gas passage openings 30. Several first gas passage openings 29 are provided in the circumferential direction and in the direction of extension of the inlet pipe 4. A gas flow that cools the wall of the flow channel 23 can flow through the flow channel 24 in order to prevent the temperature within the inlet pipe from exceeding a temperature that leads to a vaporization of the aerosol or to a melting of solid aerosol particles. Recondensation or melting that might occur then could otherwise block the inlet pipe.

The second gas passage openings 30 are located near the mouth 4'. Here, too, several second gas passage openings 30 are provided both in the circumferential direction and in the direction of extension of the inlet pipe 4. The bores forming the gas passage openings 30 have a tangential angle to the inner pipe 33, whereby the "gas jets" emerging from the second gas passage openings 30 can impose a vortex on the aerosol flow flowing in the direction of flow S. In combination with the widening 27, this leads to an expansion of the gas flow emerging from the mouth 4'. Moreover, the bores forming the second gas passage openings 30 can also have an inclination with respect to the direction of extension of the inlet pipe 4.

The widening 27 extends to the lower edge of the outer pipe 34, thus forming the mouth-side closure of the flow channel 24. As a result of the vortex produced in the mouth area, a motion component aligned transverse to the direction of extension of the inlet pipe 4 is imparted to the aerosol flow leaving the mouth, whereby the aerosol is distributed more uniformly in a spacing gap 9, 10 than would be the case if a gas flow oriented in the direction of extension of the inlet pipe 4 were to emerge from the mouth 4'.

The reference numeral 31 designates a threaded section with which the inlet pipe 4 can be screwed into a housing (not shown). For the contacting of a screw tool, a screw tool contact profile 32 is provided in the form of two opposing flat surfaces.

The foregoing embodiments serve to explain the inventions included overall by the application which develop the prior art at least through the following combinations of features, each independently, namely:

A device that is characterized in that at least one of the thermal transfer bodies 1, 2, 3 has an opening 6, 7, 8 in which an inlet pipe 4, 5 is located.

A device that is characterized in that the inlet pipe 4, 5 is guided through the opening 6, 7, 8 of the thermal transfer body 1, 2, 3 and leads to a spacing gap 9, 10 between two mutually adjacent thermal transfer bodies 1, 2; 2, 3 or to another thermal transfer body 2, 3.

A device that is characterized in that the opening 6, 7 is associated with an upstream thermal transfer body 1, 2 and the mouth 4', 5' of the inlet pipe 4, 5 is arranged in the direction of flow before a downstream thermal transfer body 2, 3 or in a downstream thermal transfer body 2, 3.

A device that is characterized in that a first upstream thermal transfer body 1 in the direction of flow is a preheating body for the carrier gas that can be fed through a carrier gas feed line 11 into a housing 12, in which housing 12 the thermal transfer bodies 1, 2, 3 are arranged successively in the direction of flow such that the carrier gas flows through all of the thermal transfer bodies 1, 2, 3.

A device that is characterized in that the thermal transfer bodies 1, 2, 3 are made of an open-pored solid foam having a porosity of 500 to 100 pores per inch, the proportion of all open areas on the surface of the solid foam particularly being greater than 90%.

A device that is characterized in that the thermal transfer body is electrically conductive and has electrical contacts 20, 21 for conducting an electrical current for the purpose of heating the thermal transfer body 1, 2, 3 to a thermal transfer temperature.

A device that is characterized in that thermal transfer bodies 1, 2, 3 arranged successively in the direction of flow can be heated to different temperatures, the thermal transfer temperature of one downstream thermal transfer body 2, 3 being greater than the thermal transfer temperature of an upstream thermal transfer body 1, 2.

A device that is characterized in that the inlet pipe has means 29, 30, 27 for allowing the aerosol flow passing in the direction of flow S through the inlet pipe 4 to emerge from the mouth 4' in expanded form.

A device that is characterized in that the inlet pipe 4 has a first flow channel 23 for feeding the aerosol in and a second flow channel 24 for feeding a carrier gas in, wherein gas passage openings 29, 30 are provided through which the carrier gas can flow out of the second flow channel 24 into the first flow channel 23 and wherein a provision is particularly made that the second flow channel 24 is sealed in the area of the mouth 4' of the inlet pipe.

A device that is characterized in that first gas passage openings 29 lead into the first flow channel 23 at such an angle to the direction of flow S of the aerosol that the carrier gas flow passing through the first gas passage openings 29 generates turbulence in the first flow channel 23, a provision particularly being made that the second flow channel 24 encloses the first flow channel 23.

A device that is characterized in that second gas passage openings 30 are arranged in the first flow channel 23 at such an angle to the direction of flow S of the aerosol that a carrier gas flow passing through the second gas passage openings 30 generates a vortex in the area of the mouth 4' about an axis aligned in the direction of flow S.

A device that is characterized in that a pipe 33 forming the first flow channel 23 has a particularly rotationally symmetrical widening 27 in the area of the mouth 4'.

A device that is characterized in that the section of the inlet pipe 4, 5 located in the opening 6, 7, 8 is enclosed by an insulating sleeve 28.

A device that is characterized by means for cooling the wall of the flow channel 23 through which the aerosol flows.

A device that is characterized in that the means for cooling has a flow channel 23 through which a coolant can be conducted.

A device that is characterized in that a return flow check valve 18, 19 is arranged before the thermal transfer body 1 in the direction of flow, which return flow check valve 18, 19 is particularly formed by two tightly adjacent plates extending over the entire flow cross section that have openings 18',19', the openings 18',19' of plates different from each other being arranged so as to be offset from each other transverse to the direction of flow.

All disclosed features (alone or in combination with each other) are essential to the invention. The disclosed content of the associated/enclosed priority documents (copy of prior application) is hereby also fully incorporated into the disclosure of the application, also for the purpose of incorporating features of these documents into claims of the present application. With their features, the subclaims characterize independent inventive developments of the prior art, particularly for the purpose of filing divisional applications on the basis of these claims.

List of Reference Symbols:

1 thermal transfer body
2 thermal transfer body
3 thermal transfer body
3' underside
4 inlet pipe
4' mouth
5 inlet pipe
5' mouth
6 opening
7 opening
8 opening
9 spacing gap
10 spacing gap
11 carrier gas feed line
12 housing
13 susceptor
14 substrate
15 processing chamber
16 gas inlet member
17 CVD reactor
18 return flow stop plate
18' opening
19 return flow stop plate
19' opening
20 electrical contacts
21 electrical contacts
22 gas outlet opening
23 flow channel
24 flow channel
25 infeed opening
26 infeed opening
27 widening
28 insulating sleeve
29 gas passage opening
30 gas passage opening
31 threaded section
32 screw tool contact profile
33 inner pipe
34 outer pipe

What is claimed is:

1. A device for generating a vapor for a chemical vapor deposition (CVD) or physical vapor deposition (PVD) apparatus, the device comprising:
   at least two thermal transfer bodies (1, 2, 3) arranged successively in a housing (12) in a direction of flow of a carrier gas and having thermal transfer surfaces, the thermal transfer bodies (1, 2, 3) including an upstream thermal transfer body (1, 2) and a downstream thermal transfer body (2, 3), such that the carrier gas that flows out of the upstream thermal transfer body (1, 2) flows into the downstream thermal transfer body (2, 3); and
   an inlet pipe (4, 5) for feeding an aerosol to one of the thermal transfer bodies (2, 3) for vaporization of the aerosol by bringing particles of the aerosol into contact with the thermal transfer surfaces, wherein at least one of the thermal transfer bodies (1, 2, 3) has an opening (6, 7, 8) in which the inlet pipe (4, 5) is located,
   wherein the thermal transfer bodies (1, 2, 3) are heated to different thermal transfer temperatures, a thermal transfer body (1) located first in the direction of flow being a preheating body for the carrier gas, which is fed through a carrier gas feed line (11) located upstream from the upstream thermal transfer body (1, 2) into the housing (12), in which housing (12) the thermal transfer bodies (1, 2, 3) are arranged successively in the direction of flow such that the carrier gas flows through all of the thermal transfer bodies (1, 2, 3), and either the inlet pipe (4, 5) is guided through the opening (6, 7, 8) of at least one of the thermal transfer bodies (1, 2, 3) and leads into a spacing gap (9, 10) between the upstream and the downstream thermal transfer bodies (1, 2; 2, 3) or a mouth (4', 5') of the inlet pipe (4, 5) is arranged in at least one of the thermal transfer bodies (2, 3).

2. The device of claim 1, wherein the opening (6, 7) is associated with the upstream thermal transfer body (1, 2) and the mouth (4', 5') of the inlet pipe (4, 5) is arranged in the direction of flow before the downstream thermal transfer body (2, 3) or in the downstream thermal transfer body (2, 3).

3. The device of claim 2, wherein the thermal transfer bodies (1, 2, 3) are made of an open-pored solid foam having a porosity of 100 to 500 pores per inch, a proportion of all open areas on a surface of the solid foam being greater than 90%.

4. The device of claim 3, wherein the thermal transfer bodies (1, 2, 3) are electrically conductive and have electrical contacts (20, 21) for conducting an electrical current for heating each of the thermal transfer bodies (1, 2, 3) to their respective thermal transfer temperatures.

5. The device of claim 4, wherein the thermal transfer bodies (1, 2, 3) are heated such that the thermal transfer temperature of the downstream thermal transfer body (2, 3) is greater than the thermal transfer temperature of the upstream thermal transfer body (1, 2).

6. A device for generating a vapor for a chemical vapor deposition (CVD) or physical vapor deposition (PVD) apparatus, the device comprising:
   at least two thermal transfer bodies (1, 2, 3) having thermal transfer surfaces, each of the thermal transfer bodies (1, 2, 3) heated to a thermal transfer temperature, the thermal transfer bodies (1, 2, 3) including an upstream thermal transfer body (1, 2) and a downstream thermal transfer body (2, 3), such that carrier gas that flows out of the upstream thermal transfer body (1, 2) flows into the downstream thermal transfer body (2, 3);
   a carrier gas feed line (11) located upstream of the upstream thermal transfer body (1, 2) for feeding the carrier gas into a housing (12) containing the thermal transfer bodies (1, 2, 3); and
   an inlet pipe (4) for feeding an aerosol to one of the thermal transfer bodies for vaporization of the aerosol by bringing particles of the aerosol in contact with the thermal transfer surfaces, wherein the carrier gas feed line (11) and the inlet pipe (4) are distinct channels,
   wherein the inlet pipe has means (29, 30; 27) for allowing the aerosol flowing in a direction of (S) through the inlet pipe (4) to emerge from a mouth (4') of the inlet pipe (4) in an expanded form.

7. The device of claim 6, wherein the inlet pipe (4) has a first flow channel (23) for feeding the aerosol into the housing (12) and a second flow channel (24) for additionally feeding the carrier gas into the housing (12), wherein gas passage openings (29, 30) are provided through which the carrier gas flows out of the second flow channel (24) into the first flow channel (23) and wherein the second flow channel (24) is sealed in an area of the mouth (4') of the inlet pipe.

8. The device of claim 7, wherein first ones of the gas passage openings (29) lead into the first flow channel (23) at such an angle to the direction of flow (S) of the aerosol that the carrier gas flowing through the first gas passage openings (29) generates turbulence in the first flow channel (23), and the second flow channel (24) encloses the first flow channel (23).

9. The device of claim 8, wherein second ones of the gas passage openings (30) are arranged in the first flow channel (23) at such an angle to the direction of flow (S) of the aerosol that the carrier gas flowing through the second gas passage openings (30) generates a vortex in the area of the mouth (4') about an axis aligned in the direction of flow (S).

10. The device of claim 9, wherein a pipe (33) forming the first flow channel (23) has a rotationally symmetrical widening (27) in the area of the mouth (4').

11. The device of claim 10, wherein a section of the inlet pipe (4, 5) located in an opening (6, 7, 8) of at least one of the thermal transfer bodies (1, 2, 3) is enclosed by an insulating sleeve (28).

12. The device of claim 11, further comprising means for cooling a wall of the first flow channel (23) through which the aerosol flows.

13. The device of claim 12, wherein the means for cooling includes the first flow channel (23) through which a coolant is conducted.

14. A device for generating a vapor for a chemical vapor deposition (CVD) or physical vapor deposition (PVD) apparatus, the device comprising:
   at least two thermal transfer bodies (1, 2, 3) that are each heated to a thermal transfer temperature, the thermal transfer bodies (1, 2, 3) including an upstream thermal transfer body (1, 2) and a downstream thermal transfer body (2, 3), such that carrier gas that flows out of the upstream thermal transfer body (1, 2) flows into the downstream thermal transfer body (2, 3);
   an inlet pipe (4, 5) for introducing an aerosol to at least one of the thermal transfer bodies, wherein at least one of the thermal transfer bodies (1, 2, 3) has an opening (6, 7, 8) in which the inlet pipe (4, 5) is located;
   a carrier gas feed line (11) located upstream from the upstream thermal transfer body (1, 2) for feeding in the carrier gas to a housing (12) containing the thermal transfer bodies (1, 2, 3); and a return flow check valve (18, 19) arranged downstream of the carrier gas feed line (11) and upstream of the thermal transfer bodies (1, 2, 3), wherein the return flow check valve (18, 19) is formed by two adjacent plates extending over an entire flow cross section of the housing (12), the return flow check valve (18, 19) having openings (18', 19') that are offset with respect to each other in a direction transverse to a direction of flow of the aerosol, wherein a mouth of the inlet pipe (4, 5) for introducing the aerosol is located downstream of the return flow check valve (18, 19).

15. The device of claim 1, wherein the carrier feed gas line (11) feeds only carrier gas.

\* \* \* \* \*